(12) United States Patent
Gilchrist et al.

(10) Patent No.: US 6,233,146 B1
(45) Date of Patent: May 15, 2001

(54) ROTATABLE PORTABLE COMPUTER REMOTE HEAT EXCHANGER WITH HEAT PIPE

(75) Inventors: Phillip C. Gilchrist, Austin; Sean P. O'Neal, Round Rock, both of TX (US)

(73) Assignee: Dell USA, L.P., Round Rock, TX (US)

( * ) Notice: Subject to any disclaimer, the term of this patent is extended or adjusted under 35 U.S.C. 154(b) by 0 days.

(21) Appl. No.: 09/363,123

(22) Filed: Jul. 28, 1999

(51) Int. Cl.⁷ ....................................... G06F 1/16
(52) U.S. Cl. ................. 361/687; 361/688; 361/689; 361/690; 361/691; 361/692; 361/693; 361/694; 361/695; 361/696; 361/697; 361/698; 361/699; 361/700; 361/701; 361/702; 361/703; 361/704; 361/707; 361/714
(58) Field of Search ......................... 361/687, 688–704, 361/707, 714

(56) References Cited

U.S. PATENT DOCUMENTS

| | | |
|---|---|---|
| 5,412,535 | 5/1995 | Chao et al. . |
| 5,424,913 | 6/1995 | Swindler . |
| 5,568,360 | 10/1996 | Penniman et al. . |
| 5,598,320 | 1/1997 | Toedtman et al. . |
| 5,712,762 | 1/1998 | Webb . |
| 5,734,550 | 3/1998 | Penniman et al. . |
| 5,822,187 | 10/1998 | Garner et al. . |
| 5,847,925 | 12/1998 | Progl et al. . |
| 5,875,095 | * 2/1999 | Webb .................................. 361/700 |
| 6,125,035 | * 9/2000 | Hood, III et al. .................... 361/687 |

\* cited by examiner

*Primary Examiner*—Leo P. Picard
*Assistant Examiner*—Yean-Hsi Chang
(74) *Attorney, Agent, or Firm*—Haynes and Boone, L.L.P.

(57) ABSTRACT

A portable computer includes a base having a heat producing electronic component mounted therein. A heat sink, also referred to as a remote heat exchanger, is positioned in the base adjacent to the heat producing component. A heat pipe has a first end permanently bonded to the heat sink and extends to a second end thermally engaged with the heat producing component. The heat sink and heat pipe assembly is rotatable about an axis of the heat sink so as to move the second end of the heat pipe into and out of thermal engagement with the heat producing component.

24 Claims, 5 Drawing Sheets

ROTATABLE PORTABLE COMPUTER REMOTE HEAT EXCHANGER WITH HEAT PIPE

CROSS REFERENCE TO CO-PENDING APPLICATIONS

This application relates to co-pending U.S. patent application Ser. No. 09/170,510, filed on Oct. 13, 1998, entitled "Heat Sink Assembly with Rotating Heat Pipe", naming Hood, III et al. as inventors. The co-pending application is incorporated herein by reference in its entirety, and is assigned to the assignee of this invention.

This application relates to co-pending U.S. patent application Ser. No. 09/129,930, filed on Aug. 6, 1998, entitled "Smart Bi-Metallic Heat Spreader", naming Moore et al. as inventors. The co-pending application is incorporated herein by reference in its entirety, and is assigned to the assignee of this invention.

This application relates to co-pending U.S. patent application Ser. No. 09/174,201, filed on Oct. 16, 1998, entitled "Heat Transfer from Base to Display Portion of a Portable Computer", naming Philip Gold as the inventor. The co-pending application is incorporated herein by reference in its entirety, and is assigned to the assignee of this invention.

This application relates to co-pending U.S. patent application Ser. No. 09/228,939, filed on Jan. 12, 1999, entitled "Hybrid Cooling Heat Exchanger Fin Geometry and Orientation", naming Podwany et al. as inventors. The co-pending application is incorporated herein by reference in its entirety, and is assigned to the assignee of this invention.

BACKGROUND

The disclosures herein relate generally to heat dissipation and more specifically to heat dissipation within a portable computer.

A portable computer is a self-contained personal computer which can be easily moved to and operated at various locations. Portable computers are often referred to as laptop or notebook computers. To be portable, these computers must be small, compact, and lightweight. The conventional portable computer includes a base portion and a lid portion that pivotally opens from the base portion when the portable computer is in use. The lid portion contains a flat panel display such as a liquid crystal display (LCD) or other suitable display.

Portable computers are being required to accommodate increasingly higher thermal loads. Central Processing Unit (CPU) power requirements are increasing along with other higher-power motherboard components. In order to cool the computer properly, larger cooling solutions are being implemented, which include heat spreaders, heat sinks, fans, and heat pipes.

One known type of heat spreader used for distributing heat away from a processor in a portable computer is a piece of metal thermally coupled to the processor. Such a heat spreader is typically made of relatively pure aluminum. Aluminum exhibits good thermal conductivity and has reduced weight over other types of metal. However, aluminum is subject to oxidation, whereby aluminum oxide coatings typically form on the outside surfaces of exposed aluminum. In the case of an aluminum heat spreader, aluminum oxide reduces the ability of the aluminum heat spreader to provide for a low impedance thermal connection.

In addition to heat spreaders, the combination of fans and heat sinks have been used to provide cost effective mechanisms for thermally managing the cooling requirements of many types of computer systems. However, fans require power and heat sinks require space. While power and space are generally in abundant supply in rack and desktop-type computers, portable computers have only a limited supply of both power and space. An operable fan may unduly draw upon the batteries of a portable computer, thus making the fan and heat sink cooling solution unattractive for long periods of battery-powered portable computer operation.

Heat pipes offer another option for a cooling solution. Heat pipes are self contained, phase transformation, heat carrying devices, i.e. each is a superconductor of heat. A typical heat pipe may comprise a closed copper tube having a partial vacuum internally. Pre-existing liquid, such as water, CCFC, or other suitable liquid, in a hot portion of the tube boils at a lower than usual temperature in the partial vacuum. The boiling liquid forms steam, which seeks a cooler spot. The steam moves to carry heat to the cooler spot where the steam condenses to cooler liquid. The cooler liquid then returns to the hot spot. The cycle is ongoing, which provides a self-contained circulating cooling system.

The following U.S. patent addresses the issue of heat dissipation within a computer. U.S. Pat. No. 5,598,320 discloses a rotatable and slidable heat pipe apparatus for transferring heat away from a microprocessor chip more rapidly than by heat sink surface area dissipation to the surrounding air alone. The apparatus includes a heat sink with an integral cylindrical passageway adapted to receive a first end of a heat pipe shaped like a crankshaft and a heat spreader formed from a metal plate with a first end rolled up to define a cylindrical opening adapted to receive a second end of the heat pipe. The heat spreader is attached to an underside of a keyboard. Since the heat pipe is able to rotate within the cylindrical passageway and the cylindrical opening, the keyboard can be raised to an open position and lowered to a closed position quickly and simply without the risk of breaking or bending the heat pipe, and manufacturing position tolerances between the heat pipe apparatus components are increased resulting in a simplified manufacturing process. The heat pipe can also be slid in and out of the cylindrical passageway or the cylindrical opening, thereby enabling computer manufacturers to incorporate the heat pipe into portable battery powered notebook-type computer systems designed to allow a user to remove, replace, or swap internal components by simply flipping open or removing the keyboard, and further enabling a user to perform maintenance work or repairs on the computer system without concern for damage to the heat pipe.

Co-pending U.S. patent application Ser. No. 09/170,510 is another example that addresses the issue of heat dissipation within a computer system. In the embodiment of FIG. 1, a first end of a heat pipe 2 is connected to a heat sink 4 by a rotatable thermal connection 6. Heat sink 4 is mounted on and fastened to a bottom member 16. Rotatable thermal connection 6 enables heat pipe 2 to retract from a first position to a second position, indicated in FIG. 1, to allow a CPU 8 to be installed directly on top of a motherboard 10. Once CPU 8 is installed, heat pipe 2 is rotated back to its first position, represented in FIG. 2, in order for a thermal block 12, which is connected to a second end of heat pipe 2, to be thermally coupled to CPU 8. A set of mounting screws 14, or other suitable fasteners, are then used to secure thermal block 12 to CPU 8.

In a build-to-order computer system manufacturing process, custom configured computer systems are assembled with hardware and software based upon a customer order. With respect to portable computers, in order to fulfill build-to-order manufacturing requirements, the CPU is preferably installed at final assembly. For the vast majority of portable computer layouts, the CPU is directly on top of the motherboard and the CPU cooling solution installed on top of the CPU. While cooling solutions can be installed after installation of the CPU, some layouts cause the cooling solution to be trapped under a palmrest and LCD. Therefore, in order to install the CPU during the build-to-order manufacturing process, either the palmrest and/or LCD assembly must be installed after the cooling solution is installed. Unfortunately, this method is undesirable since it requires additional disassembly/assembly procedures in the build-to-order manufacturing process. Further, a greater inventory of component parts is required to be maintained.

Accordingly, an improved cooling solution that can be installed in a portable computer prior to the installation of the CPU during the manufacturing process is desired.

SUMMARY

One embodiment provides a rotatable heat transfer assembly, consisting of a heat pipe permanently bonded to a heat sink, which is also referred to as a remote heat exchanger. The heat transfer assembly is rotatable about a prescribed axis to permit subsequent installation of a CPU during the manufacturing process by rotating the heat transfer assembly from a first position to a second position.

A principal advantage of this embodiment is that the build-to-order manufacturing process is improved and the requirements for maintaining additional inventory for extra parts is dramatically reduced. The CPU can now be easily installed after installation of the cooling solution. Furthermore, the present embodiments provide a rotatable heat transfer assembly held in position by a bottom contoured surface and a top contoured surface for minimizing the formation of a hot spot typically found on the bottom skin of portable computers. The hot spot is reduced since the heat sink is no longer directly mounted to a bottom member of a computer base. The present embodiments also provide for greater heat transfer between the CPU and ambient air by permanently bonding the heat pipe to the heat sink, accordingly reducing the thermal resistance at that junction.

BRIEF DESCRIPTION OF THE DRAWING FIGURES

DETAILED DESCRIPTION

Figure 1:
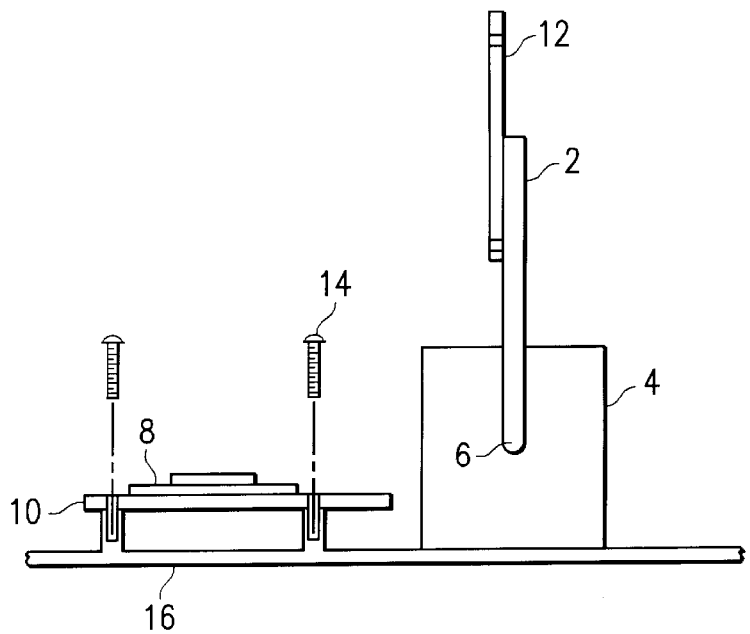
FIG. 1 is an assembled view illustrating an embodiment of the prior art.
Figure 2:
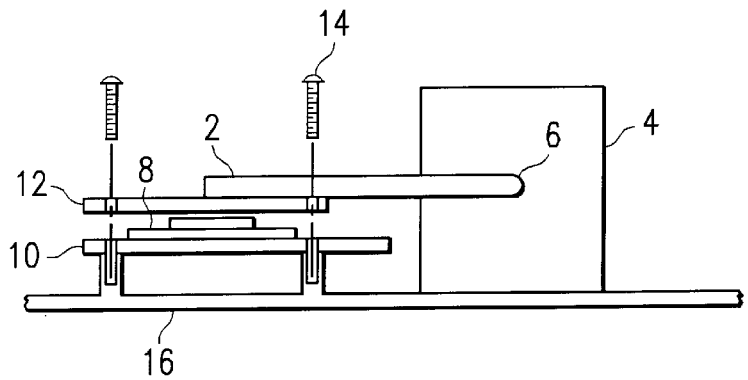
FIG. 2 is another assembled view illustrating an embodiment of the prior art.
Figure 3:
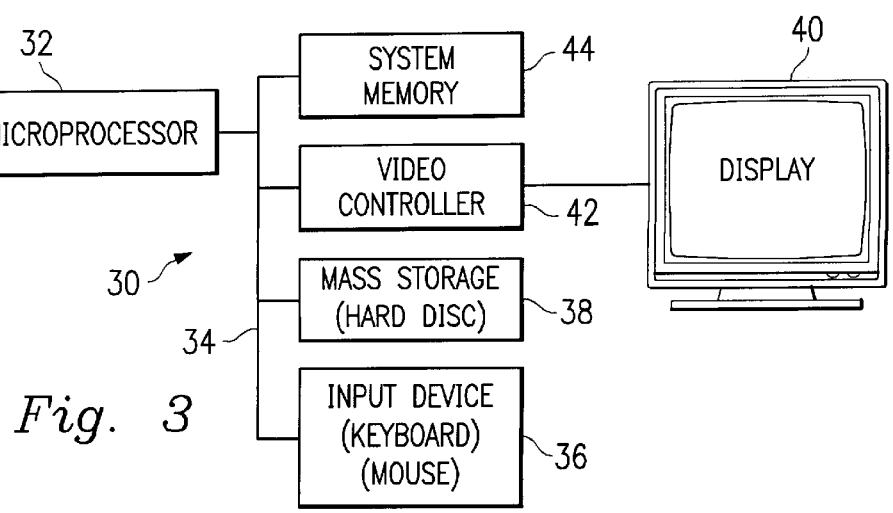
FIG. 3 is a diagrammatic view illustrating an embodiment of a computer system.

In one embodiment, depicted in FIG. 3, computer system 30 includes a microprocessor 32, which is connected to a bus 34. Bus 34 serves as a connection between microprocessor 32 and other components of computer system 30. An input device 36 is coupled to microprocessor 32 to provide input to microprocessor 32. Examples of an input device can include one or more of the following: keyboard, touchscreen, and a pointing device such as a mouse, trackball, and a trackpad. Programs and data are stored on a mass storage device 38, which is coupled to microprocessor 32. Mass storage device 38 can include at least one of the following devices, such as a hard disk, optical disk, magneto-optical drive, floppy drive and the like. Computer system 30 further includes a display 40, which is coupled to microprocessor 32 by a video controller 42. A system memory 44 is coupled to microprocessor 32 to provide the microprocessor with fast storage to facilitate execution of computer programs by microprocessor 32. It should be understood that other busses and intermediate circuits can be deployed between the components described above and microprocessor 32 to facilitate interconnection between the components and the microprocessor.

Figure 4:
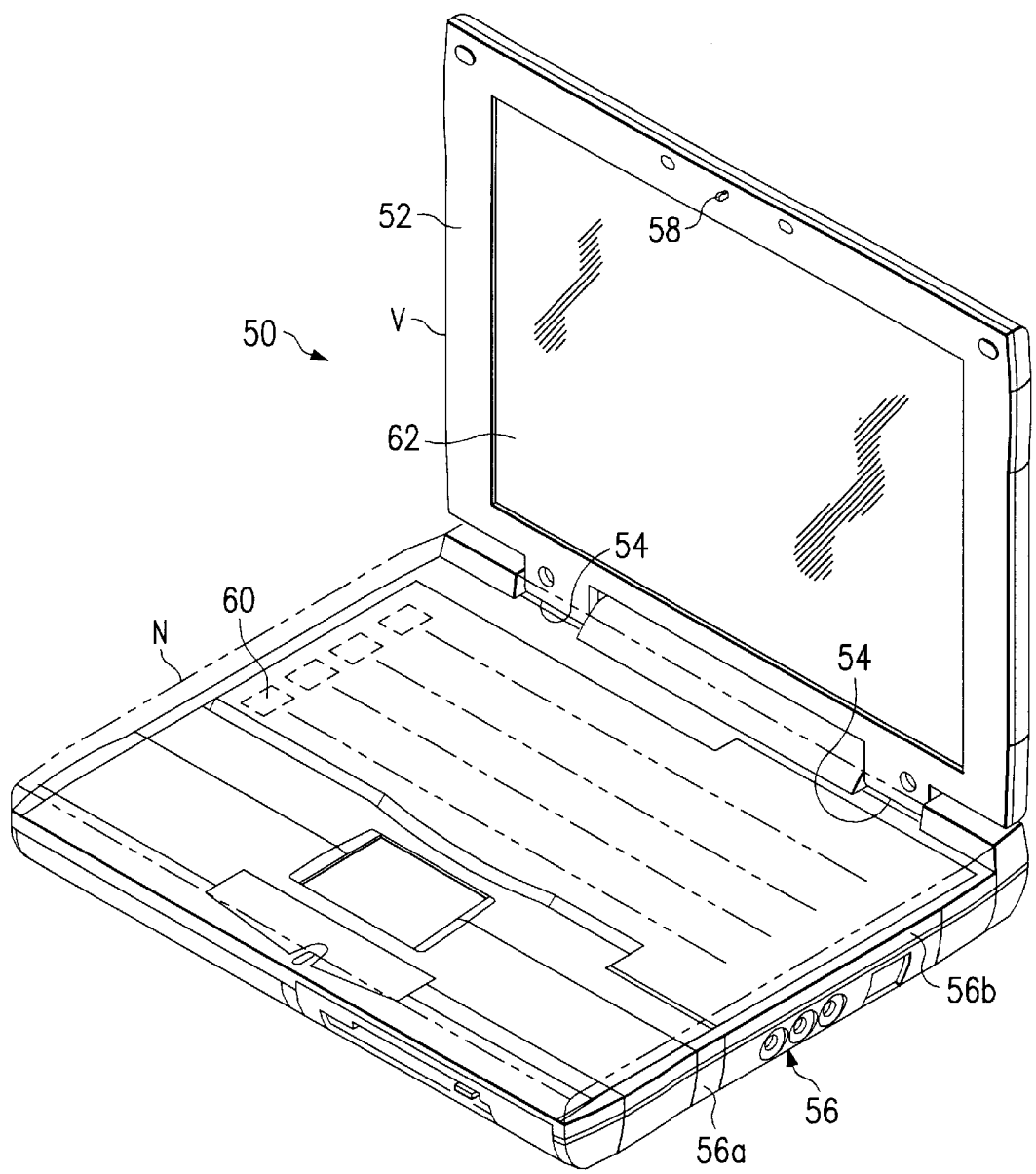
FIG. 4 is a perspective view illustrating an embodiment of a portable laptop computer.

Referring to FIG. 4, depicted is a portable, notebook size computer designated 50 comprising a self-contained system, such as that illustrated as 30 in FIG. 3. Computer 50 also includes a hinged top or lid 52 rotatable about a hinge or hinges 54 from a nested position "N", with a horizontal base 56, to substantially vertical or open position "V." Opening of the notebook style portable computer by manipulation of a latch 58, reveals a plurality of keys 60 on base 56, and a monitor screen 62 mounted in lid or top 52. Base 56 includes a bottom or first member 56a and a top or second member 56b.

Figure 5:
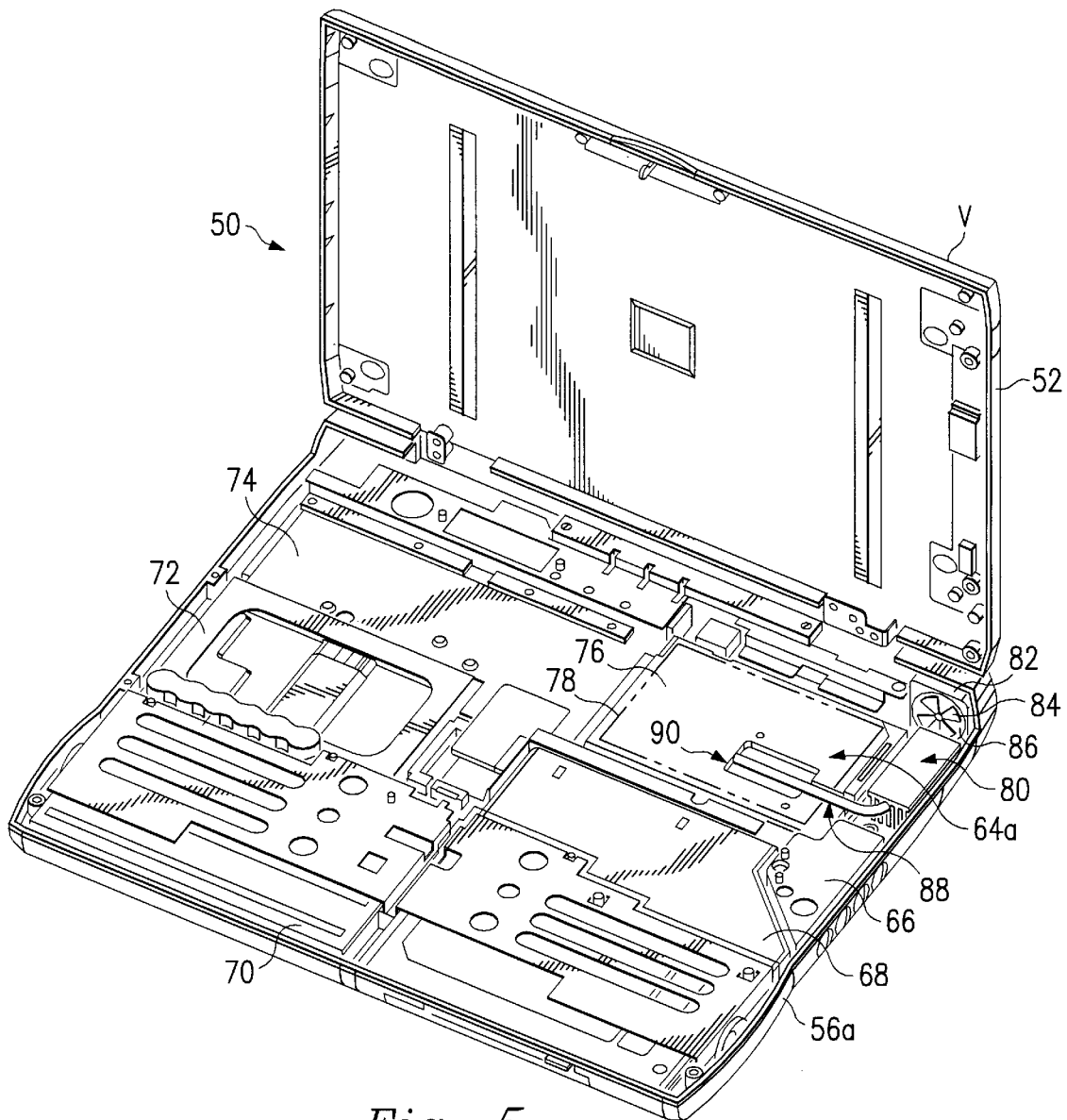
FIG. 5 is another perspective view illustrating an embodiment of a partially disassembled laptop computer.

Next, in FIG. 5, computer 50 is illustrated in a partially disassembled state showing the first member 56a of base 56 with the second or keyboard member 56b removed. With keyboard member 56b removed, some of the components mounted in base 56 are exposed. Some of the exposed components include a heat transfer assembly 64a, an audio subsection 66, a CD floppy module section 68, a battery bay section 70, a hard-disk drive section 72 and a motherboard 74. In FIG. 5, top 52 is illustrated in the open position V, with monitor screen 62 removed. Heat transfer assembly 64a includes a heat spreader cap 76 thermally coupled to CPU 78. Also included in heat transfer assembly 64a is a heat sink 80 commonly referred to as a remote heat exchanger, a fan housing 82 that includes a fan 84 mounted in a fan duct 86 in base 56. A heat pipe 88 is provided to thermally interconnect a thermal block 90, heat spreader cap 76, and heat sink 80.

Figure 6:
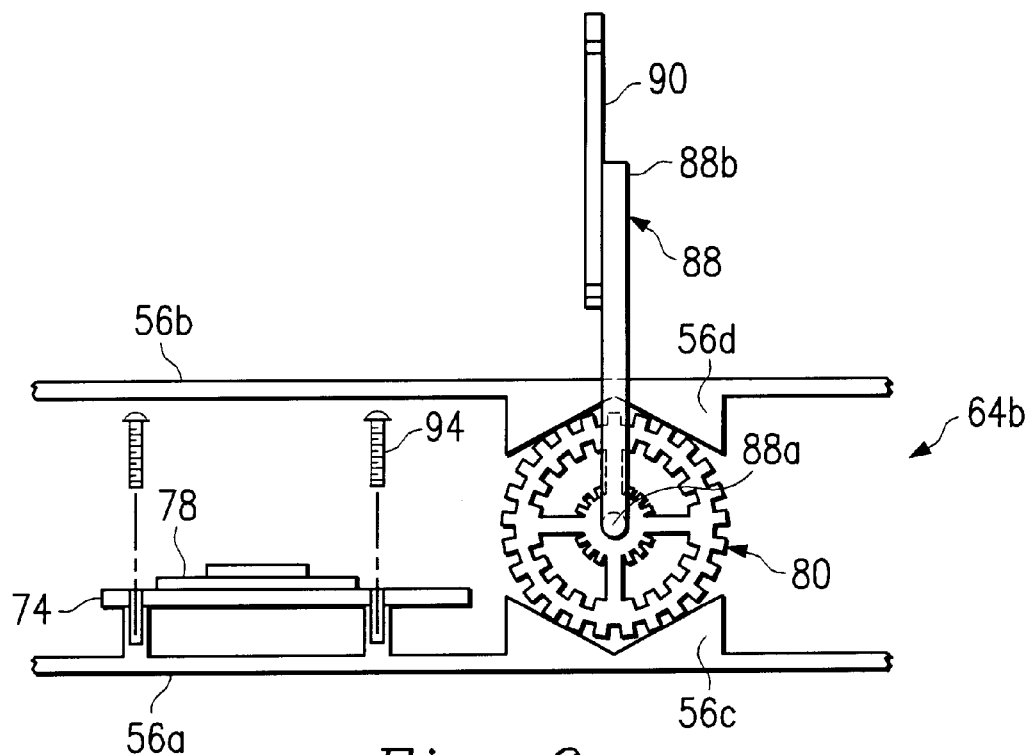
FIG. 6 is an assembled view illustrating an embodiment of a heat transfer assembly.
Figure 7:
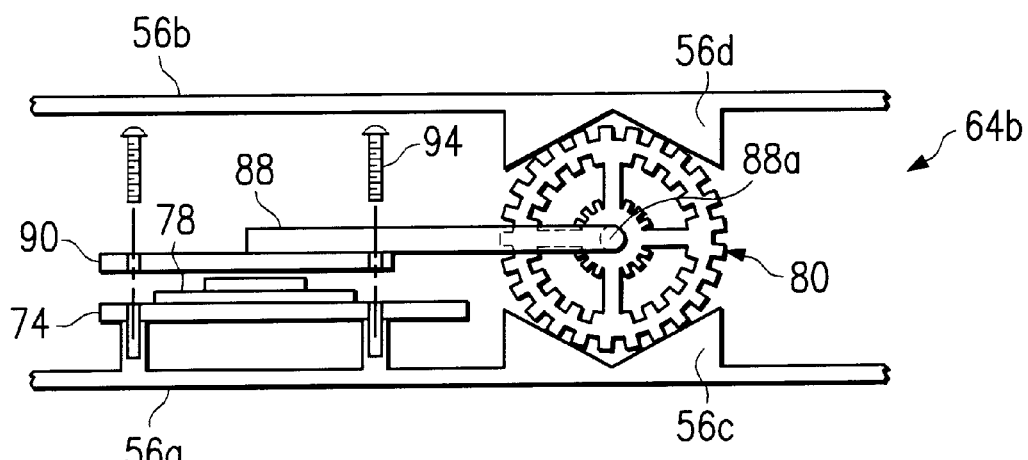
FIG. 7 is another assembled view illustrating an embodiment of a heat transfer assembly.
Figure 8:
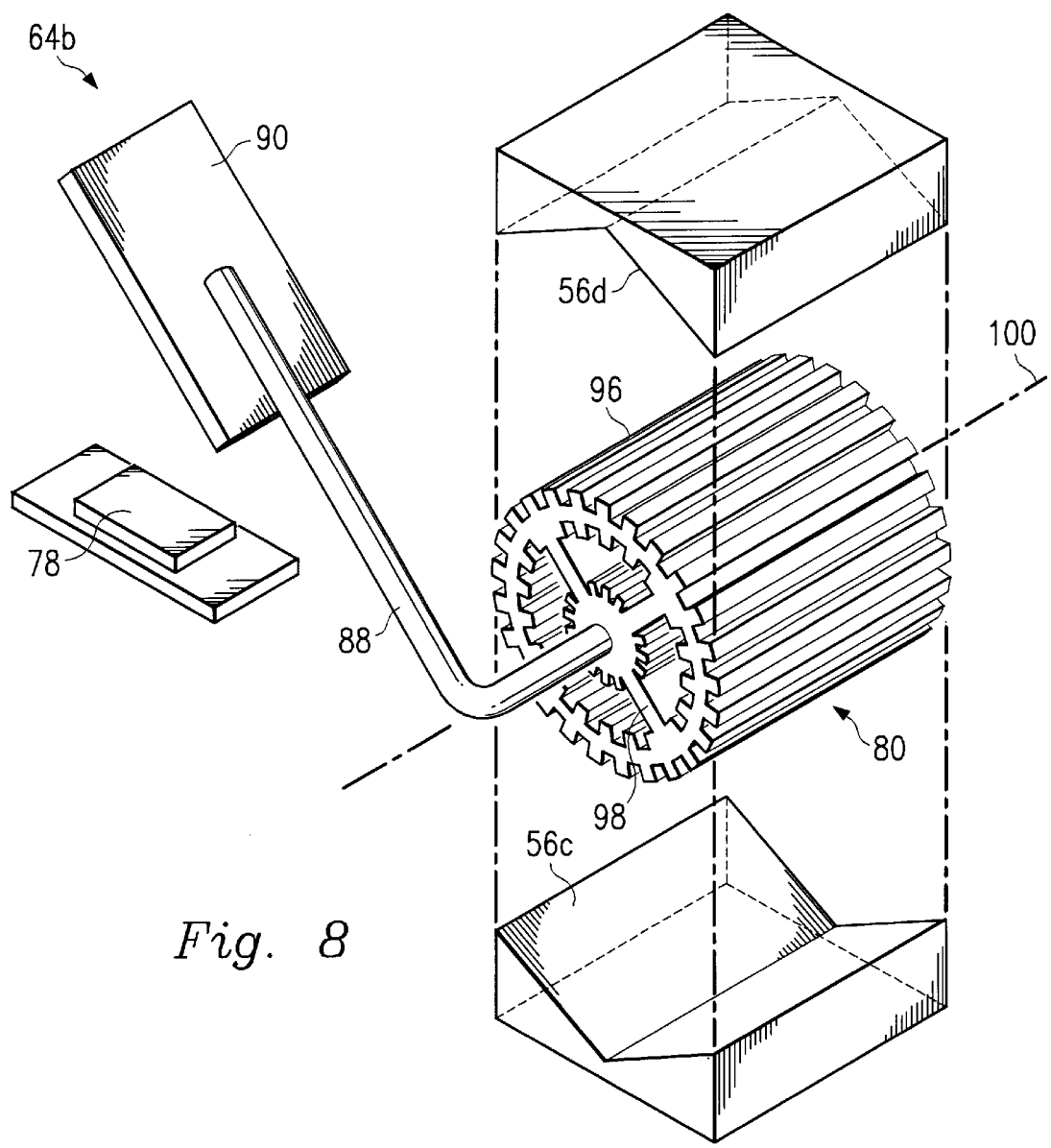
FIG. 8 is an exploded perspective view illustrating an embodiment of a heat transfer assembly.

A heat transfer assembly 64b, which is an alternative embodiment of assembly 64a, is represented in FIG. 6. Here, a first end 88a of heat pipe 88 is permanently bonded to a cylindrical heat sink 80 to create a minimum amount of thermal resistance at that junction. A rigid connection is formed at that junction as a by product of the permanently bonded junction. Accordingly, an improved heat transfer is achieved. Thermal block 90 is connected to a second end 88b of heat pipe 88. In the absence of a rotatable connection between heat pipe 88 and heat sink 80, the entire heat transfer assembly 64b is made to be rotatable, thus enabling heat pipe 88 to be rotated by simply rotating heat transfer assembly 64b about a central axis of heat sink. 80. To facilitate rotation of heat transfer assembly 64b, bottom member 56a includes a contoured surface 56c that extends upward and top member 56b includes a contoured surface 56d that extends downward. Contoured surfaces 56c and 56d engage heat sink 80 to hold heat sink 80 in place while still allowing the heat sink to rotate, as needed. Heat pipe 88 is rotated from a first position to a second position via rotation of assembly 64b, illustrated in FIG. 6, to allow for installation of CPU 78. Note that the dimensions of CPU 78 vary according to its specifications. Once CPU 78 is installed on top of motherboard 74, heat pipe 88 is rotated from the second position back to the first position via rotation of assembly 64b, as illustrated in FIG. 7. A set of mounting screws 94, or other suitable fasteners, are then used to secure and thermally couple thermal block 90 to CPU 78. An exploded perspective view of heat assembly 64b is represented in FIG. 8. FIG. 8 also clearly shows a plurality of fins 96, a plurality of ribs 98, and a central axis 100 of heat sink 80 about which assembly 64b rotates.

In operation, the embodiments disclosed herein utilize a rotatable heat transfer assembly to allow the CPU to be accessed during the manufacturing of a notebook computer with minimal disassembly of the system. The heat transfer assembly is thus able to be positioned within the computer base in advance of a final assembly without unduly impeding installation of the CPU at final assembly.

As a result, one embodiment provides a heat transfer assembly that includes a heat pipe permanently bonded to a heat sink.

Another embodiment provides a portable computer having a heat producing component mounted therein. A heat sink is positioned in a computer base. A heat pipe has a first end permanently bonded to the heat sink and a second end in thermal engagement with the heat producing component, wherein the heat sink and heat pipe assembly is rotatable about a central axis of the heat sink to move or disengage the second end of the heat pipe away from the heat producing component.

Meanwhile, another embodiment provides a computer system including a microprocessor, an input coupled to provide input to the microprocessor, a mass storage coupled to the microprocessor, a display coupled to the microprocessor by a video controller, and a memory coupled to provide storage to facilitate execution of computer programs by the microprocessor. A heat sink is positioned in a computer base. A heat pipe has a first end permanently bonded to a heat sink and a second end in thermal engagement with the microprocessor, wherein the heat sink and heat pipe assembly is rotatable about a central axis of the heat sink to move or disengage the second end of the heat pipe from the microprocessor.

A further embodiment provides a method of mounting a heat transfer assembly in a computer base. The method includes mounting a heat producing component in the computer base, positioning a heat sink in the computer base, and permanently bonding a heat pipe to the heat sink so that the heat sink and heat pipe assembly is capable of a prescribed rotational movement into and out of thermal engagement with the heat producing component.

A principal advantage of these embodiments is that the CPU can be easily installed during the manufacturing process after installation of the cooling solution. The entire cooling solution can be tested at the board assembly level prior to a final assembly, thus reducing opportunities for defects in the cooling solution during the manufacturing process. With the present embodiments, fewer parts need to be handled at final assembly. Furthermore, connection of the heat pipe to the CPU during the manufacturing process is self-fixtured at final assembly. As a result, installation of the CPU and the manufacturing process are less prone to defects.

With the present embodiments, a fixed thermal connection between the heat pipe and heat sink provides an improved cooling solution having a lower thermal resistance, advantageously enabling the portable computer to accommodate increasing thermal demands. Furthermore, the rotatable heat transfer assembly that is held in position by a bottom contoured surface and a top contoured surface minimizes the hot spot typically found on the bottom skin of portable computers. The hot spot is reduced since the heat sink is no longer directly mounted on and fastened to a bottom member of a computer base. The present embodiments also provide for greater heat transfer between the heat sink and ambient air due to the improved reduction in thermal resistance at the junction of the heat pipe and heat sink.

Although illustrative embodiments have been shown and described, a wide range of modifications, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A heat transfer assembly comprising:
    a heat sink having an inner volume, a first end, and a second end;
    a heat pipe having a first end permanently bonded to the first end of said heat sink; and
    said heat sink being disposed between an upper contoured member and a lower contoured member to enable a rotation of said heat sink and said heat pipe as a unit about a central axis of said heat sink with respect to the upper and lower contoured members.

2. The assembly as defined in claim 1 wherein said heat sink is cylindrical.

3. The assembly as defined in claim 1 further comprising: a thermal block connected to a second end of said heat pipe, opposite the first end.

4. The assembly as defined in claim 1 wherein a surface of said heat sink includes a plurality of fins.

5. The assembly as defined in claim 1 wherein the inner volume of said heat sink is characterized by a plurality of ribs.

6. The assembly as defined in claim 1 further comprising: at least one fan proximate the second end of said heat sink.

7. A portable computer comprising:
    a computer base consisting of a bottom member and a top member;
    a heat producing component mounted in said computer base;
    a heat sink positioned within said computer base, wherein said heat sink has an inner volume, a first end, and a second end;
    a heat pipe having a first end permanently bonded to the first end of said heat sink and a second end of said heat pipe thermally coupled to said heat producing component, wherein said heat sink and said heat pipe form an assembly that is rotatable about a central axis of said heat sink to move the second end of said heat pipe away from said heat producing component; and
    said heat sink being held in a desired position by a contoured surface extending up from the bottom member of said computer base and a contoured surface extending down from the top member of said computer base.

8. The portable computer as defined in claim 7 wherein said heat sink is cylindrical.

9. The portable computer as defined in claim 7 further comprising: a thermal block connected to the second end of said heat pipe, the thermal block being thermally coupled between said heat pipe and said heat producing component.

10. The portable computer as defined in claim 7 wherein a surface of said heat sink includes a plurality of fins.

11. The portable computer as defined in claim 7 wherein the inner volume of said heat sink is characterized by a plurality of ribs.

12. The portable computer as defined in claim 7 further comprising: at least one fan proximate the second end of said heat sink.

13. The portable computer as defined in claim 7 further comprising: a heat spreader cap proximate said heat producing component, said heat spreader cap for assisting in dissipating heat away from said heat producing component.

14. A computer system comprising:

a microprocessor;

an input coupled to provide input to the microprocessor;

a mass storage coupled to the microprocessor;

a display coupled to the microprocessor by a video controller;

a memory coupled to provide storage to facilitate execution of computer programs by the microprocessor;

a computer base consisting of a bottom member and a top member;

a heat sink positioned within said computer base, wherein said heat sink has an inner volume, a first end, and a second end;

a heat pipe having a first end permanently bonded to the first end of said heat sink and a second end of said heat pipe thermally coupled to said microprocessor, wherein said heat sink and said hat pipe form an assembly that is rotatable about a central axis of said heat sink to move the second end of said heat pipe away from said microprocessor;

said heat sink being held in a desired position by a contoured surface extending up from the bottom member of said computer base and a contoured surface extending down from the top member of said computer base.

15. The computer system as defined in claim 14 wherein said heat sink is cylindrical.

16. The computer system as defined in claim 14 further comprising: a thermal block connected to the second end of said heat pipe, the thermal block being thermally coupled between said heat pipe and said heat producing component.

17. The computer system as defined in claim 14 wherein a surface of said heat sink includes a plurality of fins.

18. The computer system as defined in claim 14 wherein the inner volume of said heat sink is characterized by a plurality of ribs.

19. The computer system as defined in claim 14 further comprising: at least one fan proximate the second end of said heat sink.

20. The computer system as defined in claim 14 further comprising: a heat spreader cap proximate said microprocessor, said heat spreader cap for assisting in dissipating heat away from said microprocessor.

21. A method of providing heat transfer in a computer system comprising:

providing a hat producing component in a base member of the computer system;

permanently bonding a first end of a heat pipe to a first end of a heat sink to form an assembly;

positioning the heat sink and the heat pipe assembly in the computer base wherein a second end of said heat pipe is thermally coupled to the heat producing component; and providing a contoured surface extending up from a bottom member of the computer base and a contoured surface extending down from a top member of the computer base, the contoured surfaces for frictionally engaging the heat sink.

22. The method as defined in claim 21 further comprising the step of providing a thermal block on the second end of the heat pipe.

23. The method as defined in claim 21 further comprising the step of providing at least one fan proximate the second end of the heat sink.

24. The method as defined in claim 21 further comprising the step of providing a heat spreader cap proximate the heat producing component.

* * * * *